US008918579B2

(12) United States Patent (10) Patent No.: US 8,918,579 B2
Kettner (45) Date of Patent: Dec. 23, 2014

(54) STORAGE DEVICE AND METHOD FOR SELECTIVE DATA COMPRESSION

(75) Inventor: Doron Kettner, Rishon Le Zion (IL)

(73) Assignee: SanDisk Technologies Inc., Plano, TX (US)

( * ) Notice: Subject to any disclaimer, the term of this patent is extended or adjusted under 35 U.S.C. 154(b) by 249 days.

(21) Appl. No.: 13/367,171

(22) Filed: Feb. 6, 2012

(65) Prior Publication Data

US 2013/0205110 A1 Aug. 8, 2013

(51) Int. Cl.
*G06F 12/00* (2006.01)

(52) U.S. Cl.
USPC .............................. 711/103; 710/68; 711/162

(58) Field of Classification Search
CPC ............ G06F 12/0238; G06F 12/0246; G06F 2212/401
USPC ...................... 711/103, E12.008, 162; 710/68
See application file for complete search history.

(56) References Cited

U.S. PATENT DOCUMENTS

| | | | |
|---|---|---|---|
| 5,551,020 A | 8/1996 | Flax et al. | |
| 5,675,789 A | 10/1997 | Ishii et al. | |
| 5,819,082 A | 10/1998 | Marion | |
| 6,038,033 A * | 3/2000 | Bender et al. ................ | 358/1.16 |
| 6,038,571 A * | 3/2000 | Numajiri et al. ....................... | 1/1 |
| 6,360,300 B1 | 3/2002 | Corcoran et al. | |
| 6,658,528 B2 | 12/2003 | Archibald, Jr. et al. | |
| 6,681,307 B1 | 1/2004 | Humlicek et al. | |
| 7,024,512 B1 * | 4/2006 | Franaszek et al. ............ | 711/100 |
| 7,161,506 B2 | 1/2007 | Fallon | |
| 7,190,284 B1 | 3/2007 | Dye et al. | |
| 7,603,532 B2 | 10/2009 | Rajan et al. | |
| 7,765,346 B2 | 7/2010 | De Peuter et al. | |
| 7,890,730 B2 | 2/2011 | Rave et al. | |
| 7,958,331 B2 | 6/2011 | Iren et al. | |
| 8,495,267 B2 * | 7/2013 | Abali et al. .................... | 710/262 |
| 2006/0218207 A1 | 9/2006 | Nonaka | |
| 2007/0266037 A1 | 11/2007 | Terry et al. | |
| 2008/0005380 A1 * | 1/2008 | Kawasaki et al. ................ | 710/15 |
| 2008/0140668 A1 * | 6/2008 | Corrion .......................... | 707/10 |
| 2008/0148004 A1 | 6/2008 | Iren et al. | |
| 2008/0229048 A1 | 9/2008 | Murase et al. | |
| 2010/0153474 A1 | 6/2010 | Raines et al. | |
| 2010/0228795 A1 | 9/2010 | Hahn et al. | |
| 2010/0235605 A1 | 9/2010 | Perry et al. | |
| 2011/0218966 A1 | 9/2011 | Barnes et al. | |
| 2011/0258241 A1 | 10/2011 | Raines et al. | |
| 2012/0089826 A1 | 4/2012 | Ugokwe | |
| 2012/0210113 A1 | 8/2012 | Wood et al. | |

OTHER PUBLICATIONS

U.S. Appl. No. 13/367,154, entitled, "Storage Device Unaware of I/O Transactions and Stored Data", filed Feb. 6, 2012, 37 pages.

(Continued)

*Primary Examiner* — Jared Rutz
*Assistant Examiner* — Mehdi Namazi
(74) *Attorney, Agent, or Firm* — Brinks Gilson & Lione

(57) ABSTRACT

A storage device and method for selective data compression are provided. In one embodiment, a storage device determines whether data stored in a storage area in the storage device's memory is suitable for compression. If the data is suitable for compression, the storage device compresses the data. The storage device then uses free memory space resulting from compressing the data for an internal storage device operation. Other embodiments are disclosed, and each of the embodiments can be used alone or together in combination.

20 Claims, 17 Drawing Sheets

(56) References Cited

OTHER PUBLICATIONS

U.S. Appl. No. 13/367,160, entitled, "Storage Device and Method for Utilizing Unused Storage Space", filed Feb. 6, 2012, 38 pages.
International Search Report and Written Opinion for PCT/US2013/020084, dated Apr. 3, 2013, 9 pages.
Office Action for U.S. Appl. No. 13/367,154 dated Aug. 29, 2013, 10 pages.
Office Action for U.S. Appl. No. 13/367,160, dated Oct. 4, 2013, 9 pages.
Office Action issued in U.S. Appl. No. 13/367,154, mailed Apr. 23, 2014, 11 pages.
Office Action issued in U.S. Appl. No. 13/367,160, mailed May 7, 2014, 10 pages.

* cited by examiner

STORAGE DEVICE AND METHOD FOR SELECTIVE DATA COMPRESSION

BACKGROUND

Storage devices, such as memory cards and solid-state drives, are written to and read from according to and based on commands that are received from a host device. For example, a host device can send a read command to the storage device to retrieve data and send a write command to the storage device to store data. In many situations, the host device sends a logical address with the read or write command, and a controller in the storage device translates the logical address to a physical address of the memory of the storage device. As a storage device often just responds to commands from the host device, the storage device is not aware of the type of data being read from or written to the storage device.

Overview

Embodiments of the present invention are defined by the claims, and nothing in this section should be taken as a limitation on those claims.

By way of introduction, the below embodiments relate to a storage device and method for selective data compression. In one embodiment, a storage device determines whether data stored in a storage area in the storage device's memory is suitable for compression. If the data is suitable for compression, the storage device compresses the data. The storage device then uses free memory space resulting from compressing the data for an internal storage device operation. Other embodiments are disclosed, and each of the embodiments can be used alone or together in combination.

Other embodiments are possible, and each of the embodiments can be used alone or together in combination. Accordingly, various embodiments will now be described with reference to the attached drawings.

DETAILED DESCRIPTION OF THE PRESENTLY PREFERRED EMBODIMENTS

General Overview

There are several embodiment disclosed herein, which can be used alone or together in combination. One embodiment relates to a storage device that is aware of I/O transactions and stored data. As mentioned in the background section, data in many of today's storage devices is typically written to/read from the storage device according to and based on commands that are received from the host device, regardless of the characteristics and meaning of the information being stored. This embodiment uses various detection mechanisms to determine relevant information and uses that information to optimize host requests handling. This can enable a storage device to alter its behavior based on knowledge driven by the data stored on it, how this data is stored and accessed (e.g., write/read patterns), and prior system knowledge. This allows the storage device to optimize its operation and achieve higher reliability without involving the host device.

Another embodiment is directed to a storage device and method for utilizing unused storage space. Storage devices today may contain storage space which, in high probability, will not be used during the lifetime of the storage device. In this embodiment, the storage device uses already-retrieved knowledge on data being transferred to/from it as well as the way this data is being transferred (e.g. protocol, pattern, etc.) to identify non-active storage areas in the memory that, in high probability, will not be used. This provides the storage device with the ability to better exploit unused user storage areas in the memory, which may optimize storage behavior and improve reliability and performance of the device.

Yet another embodiment is directed to a storage device and method for selective data compression. Most storage devices that use on-the-fly compression do not take into consideration the type of data that is being compressed or any other relevant knowledge. In this embodiment, the storage device utilizes knowledge of the data being transferred to/from it or data that is already stored to perform selective on-the-fly data compression.

Exemplary Host and Storage Devices

Figure 1:
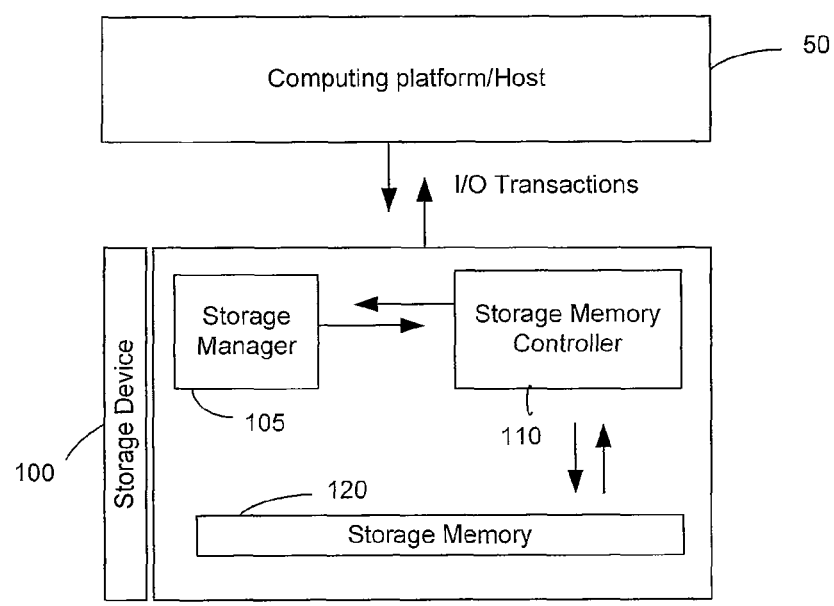
FIG. 1 is a block diagram of an exemplary host device and storage device of an embodiment.

Turning now to the drawings, FIG. 1 is a block diagram of a host device (computing platform/host) 50 and a storage device 100 of an embodiment. As shown in FIG. 1, the storage device 100 comprises a storage manager 105, a storage memory controller 110, and storage memory 120. In one embodiment, the storage manager is software or firmware executed by the storage memory controller 110. As shown by the arrows, I/O transactions are sent between the host device 50 and the storage device 100. In general, a computing platform/host is a device that the storage device is in communication with. A computing platform typically includes some sort of hardware architecture and a software framework (including application frameworks). The combination allows software to run. Typical platforms include a computer's architecture, operating system, programming languages, and related user interface (e.g., run-time system libraries or graphical user interface). The "storage device" is a device that stores data from the computing platform/host device.

Figure 2:
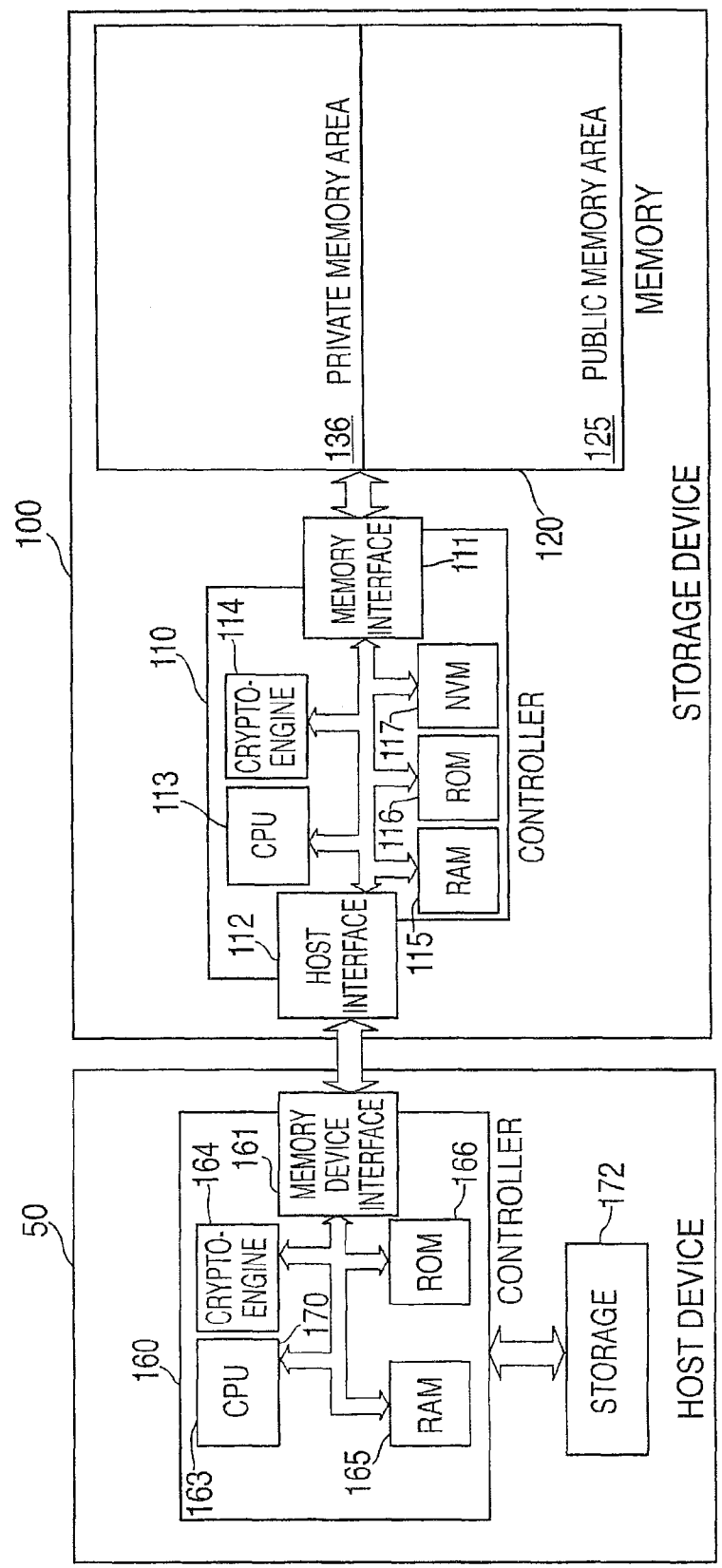
FIG. 2 is a block diagram of an exemplary host device and storage device of an embodiment.

FIG. 2 is a more detailed block diagram of the host device 50 and the storage device 100 of an embodiment. As used herein, the phrase "in communication with" could mean directly in communication with or indirectly in communication with through one or more components, which may or may not be shown or described herein. For example, the host device 50 and storage device 100 can each have mating physical connectors that allow the storage device 100 to be removably connected to the host device 50. The host device 50 can take any suitable form, such as, but not limited to, a mobile phone, a digital media player, a game device, a personal digital assistant (PDA), a personal computer (PC), a kiosk, a set-top box, a TV system, a book reader, or any combination thereof. In this embodiment, the storage device 100 is a mass storage device that can take any suitable form, such as, but not limited to, an embedded memory (e.g., a secure module embedded in the host device 50) and a handheld, removable memory card (e.g., a Secure Digital (SD) card, or a MultiMedia Card (MMC)), as well as a universal serial bus (USB) device and a removable or non-removable hard drive (e.g., magnetic disk or solid-state or hybrid drive). In one embodiment, the storage device 100 can take the form of an iNAND™ eSD/eMMC embedded flash drive by SanDisk Corporation.

As shown in FIG. 2, the storage device 100 comprises a controller 110 and a memory 120. The controller 110 comprises a memory interface 111 for interfacing with the memory 120 and a host interface 112 for interfacing with the host 50. The controller 110 also comprises a central processing unit (CPU) 113, a hardware crypto-engine 114 operative to provide encryption and/or decryption operations, read access memory (RAM) 115, read only memory (ROM) 116 which can store firmware for the basic operations of the storage device 100, and a non-volatile memory (NVM) 117 which can store a device-specific key used for encryption/decryption operations. In one embodiment, the storage manager 105 software/firmware is stored in the RAM 115, ROM 116, NVM 117, or the memory 120 and is executed by the controller 110. The controller 110 can be implemented in any suitable manner. For example, the controller 110 can take the form of a microprocessor or processor and a computer-readable medium that stores computer-readable program code (e.g., software or firmware) executable by the (micro)processor, logic gates, switches, an application specific integrated circuit (ASIC), a programmable logic controller, and an embedded microcontroller, for example. Examples of controllers include, but are not limited to, the following microcontrollers ARC 625D, Atmel AT91SAM, Microchip PIC18F26K20, and Silicon Labs C8051F320.

The memory 120 can take any suitable form. In one embodiment, the memory 120 takes the form of a solid-state (e.g., flash) memory and can be one-time programmable, few-time programmable, or many-time programmable. However, other forms of memory, such as optical memory and magnetic memory, can be used. In this embodiment, the memory 120 comprises a public memory area 125 that is managed by a file system on the host 50 and a private memory area 136 that is internally managed by the controller 110. The private memory area 136 can store a shadow master boot record (MBR) (as will be described below), as well as other data, including, but not limited to, content encryption keys (CEKs) and firmware (FW) code. However, access to the various elements in the private memory area 136 can vary. The public memory area 125 and the private memory area 136 can be different partitions of the same memory unit or can be different memory units. The private memory area 136 is "private" (or "hidden") because it is internally managed by the controller 110 (and not by the host's controller 160).

Turning now to the host 50, the host 50 comprises a controller 160 that has a storage device interface 161 for interfacing with the storage device 100. The controller 160 also comprises a central processing unit (CPU) 163, an optional crypto-engine 164 operative to provide encryption and/or decryption operations, read access memory (RAM) 165, read only memory (ROM) 166, a security module 171, and storage 172. The storage device 100 and the host 150 communicate with each other via a storage device interface 161 and a host interface 112. For operations that involve the secure transfer of data, it is preferred that the crypto-engines 114, 164 in the storage device 100 and host 150 be used to mutually authenticate each other and provide a key exchange. After mutual authentication is complete, it is preferred that a session key be used to establish a secure channel for communication between the storage device 150 and host 100. Alternatively, crypto-functionality may not be present on the host side, where authentication is done only using a password. In this case, the user types his password into the host device 50, and the host device 50 sends it to the storage device 100, which allow access to the public memory area 125. The host 50 can contain other components (e.g., a display device, a speaker, a headphone jack, a video output connection, etc.), which are not shown in FIG. 2 to simplify the drawings.

Embodiments Relating to a Storage Device being Aware of I/O Transactions and Stored Data As mentioned above, data in many of today's storage devices is typically written to/read from the storage device according to and based on commands that are received from the host device, regardless of the characteristics and meaning of the information being stored. Also, no predefined knowledge of the system is accounted for. This embodiment is generally directed to the use of data being transferred to/from the storage device, as well as the way this data is being transferred (e.g. protocol, pattern) to add knowledge to the storage manager of the storage device to optimize and utilize its work. This can be accomplished with or without support or handshake or other information coming from the host device. In other words, this embodiment proposes a way for handling host requests for data (e.g., read and write requests) based on the characteristics of the host-requested data, characteristics of other data already residing on the storage device, or any predefined knowledge in a manner that is transparent to the host device. In general, these embodiments use predefined file system (FS) knowledge to optimize the storage device's operation. This is sometimes referred to herein as "file system awareness." This embodiment will now be described in more detail below.

First, as an optional step, the storage device 100 can internally access data for determining the logical partition layout of the storage device 100. For example, the storage device 100 can probe the boot record to identify the logical partitions layout of the storage device. Alternatively, other methods can be used to determine the logical partition layout of the storage device. The boot record can be stored in a boot block or sector, which is a region of the storage device 100 that contains machine code intended to be executed by built-in firmware. This region has a size and location (perhaps corresponding to a single logical disk sector in the CHS addressing scheme or like a globally unique identifier (GUID) partition table) specified by the design of the computing platform. The usual purpose of a boot sector is to boot a program (usually, but not necessarily, an operating system) stored on the same storage device. As used herein, a "block" is a unit of storage space that the storage device can manage, read, and write.

Next, the file system type of each logical partition is identified. This can be done, for example, based on information stored in the logical partition layout. For each file system, the storage device 100 can analyze the file system tables and data structures to identify information to the storage manager (e.g., metadata, "hot spot blocks," special locations in the memory, and/or special data patterns and upcoming operations). A few examples of such information may include, but is not limited to: data that is being used as temporary data; data designated to be stored as backup; data stored as a virtual memory or as a swap file or in a swap disk; information, such as metadata and its location in the file system (e.g., file allocation tables in a FAT file system include sensitive metadata information that is located at the beginning of the logical partition associated with the file system); and non-active storage areas in the memory that (in high probability) will not be used (e.g., areas located between two logical partitions and not covered by any of them).

Based on this obtained information, the storage manager of the storage device controller can optimize host request handling (such as: read, write, erase or other accesses involving or not involving data). For example, the storage device controller can identify frequently used storage areas (e.g., most accessed or most likely to be accessed storage areas, such as a FAT table) and handle them accordingly. As another example, the storage device controller can identify "volatile in behavior" data (e.g., data which might be "lost" without compromising the integrity of the system), which may involve caching the volatile data without actually storing it in the internal non-volatile memory of the storage device, or storing this data in memory areas that lack power failure immunity. As yet another example, the storage device controller can use the identified not active storage areas for extending the memory management capabilities. Additionally, the storage device controller can perform selective data compression on, for example, data that is identified as being less sensitive to performance such as backup data, data that may have high compression efficiency, and data that is rarely accessed. Selective data compression will be described in more detail below.

There are several advantages associated with this embodiment. For example, this embodiment can enable a storage manager within a storage device to alter its behavior based on knowledge driven by the data stored on it, how this data is stored and accessed (e.g., write/read patterns), and prior system knowledge. Such different behaviors can enable the storage device to optimize its operation, as well as achieve higher reliability. All this can be achieved in a manner which is transparent to the host device.

Figure 3:
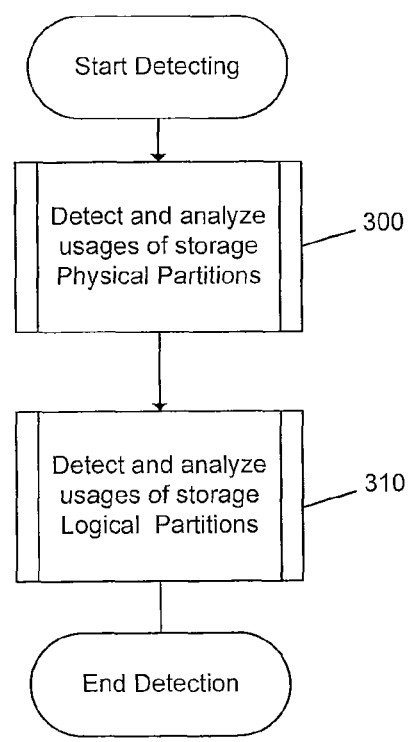
FIG. 3 is a flow chart of a detection process of an embodiment.
Figure 4:
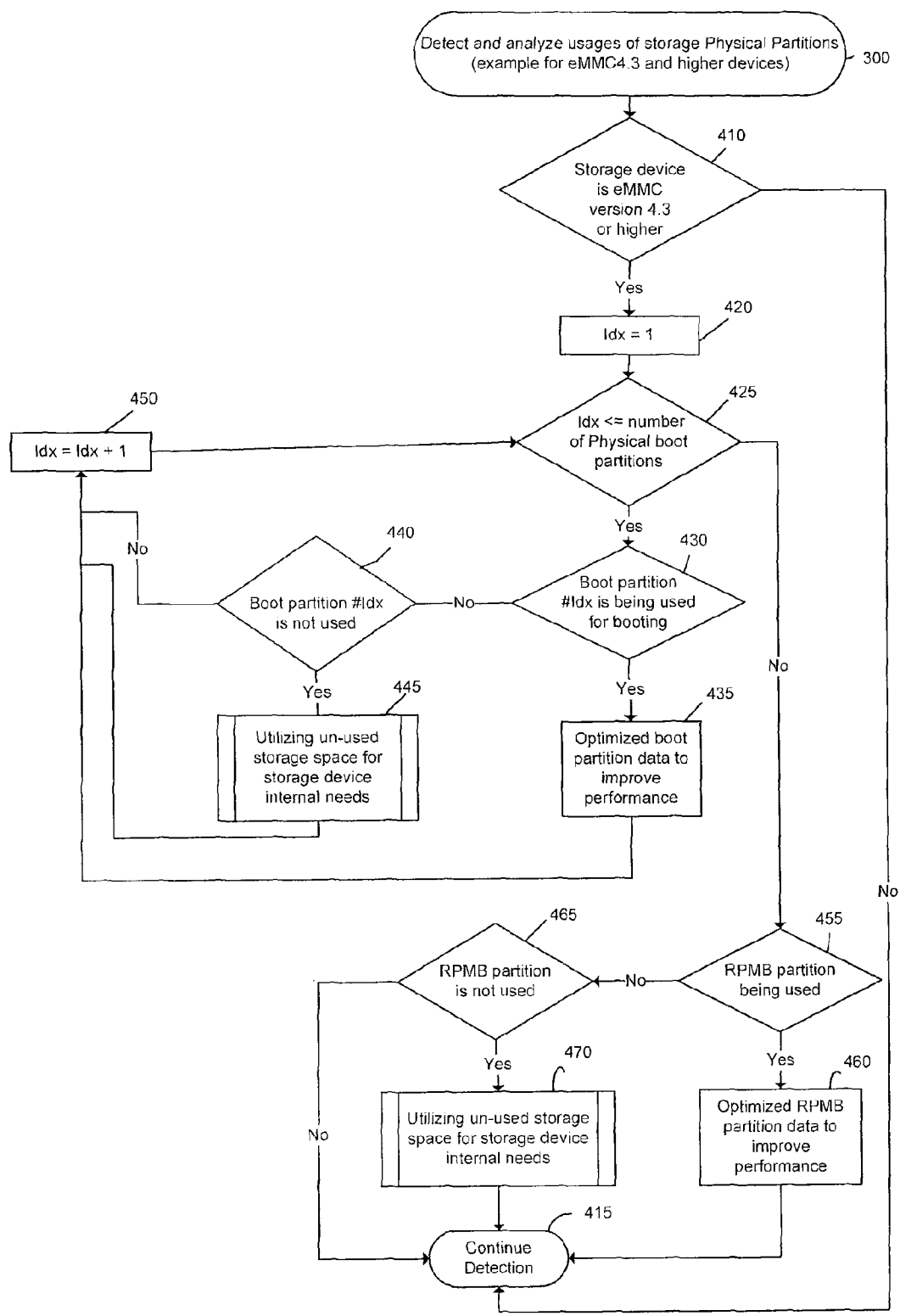
FIG. 4 is a flow chart of a process to detect and analyze usages of physical partitions of an embodiment.

Returning to the drawings, FIGS. 3-9 are flow charts that illustrate the above steps in more detail. FIG. 3 shows an overview of the detection process, with the storage device 100 first detecting and analyzing usages of stored physical partitions (act 300) and then detecting and analyzing usages of stored logical partitions (act 310). FIG. 4 shows a process of detecting and analyzing usages of stored physical partitions in more detail, using, as an example, an embedded multimedia card (eMMC) version 4.3 or higher device. First, it is determined whether the storage device 100 is eMMC version 4.3 or higher (act 410). If it is not, the detection process continues (act 415). If it is, an index is set to one (act 420), and it is determined if the index is less than or equal to the number of physical boot partitions (act 425). If the index is less than or equal to the number of physical boot partitions, it is then determined if the boot partition at that index is being used for booting (act 430). If the boot partition at that index is being used for booting, the boot partition data is optimized to improve performance (act 435). If the boot partition at that index is not being used for booting, it is determined if the boot partition at that index is used at all (act 440). If the boot partition at that index is used, any un-utilized storage space is utilized for storage device internal needs (act 445). Otherwise, the index is increased (act 450), and act 425 is performed again, where it is determined if the index is less than or equal to the number of physical boot partitions.

If the index is greater than the number of physical boot partitions, it is determined if a replay protected memory block (RPMB) partition is being used for boot (act 455). If it is, the RPMB partition data is optimized to improve performance (act 460). If it is not, it is determined if the RPMB partition is being used at all (act 465). If it is not, the detection process continues (act 415). If it is being used, un-used storage space is utilized for storage device internal needs (act 470).

Figure 5:
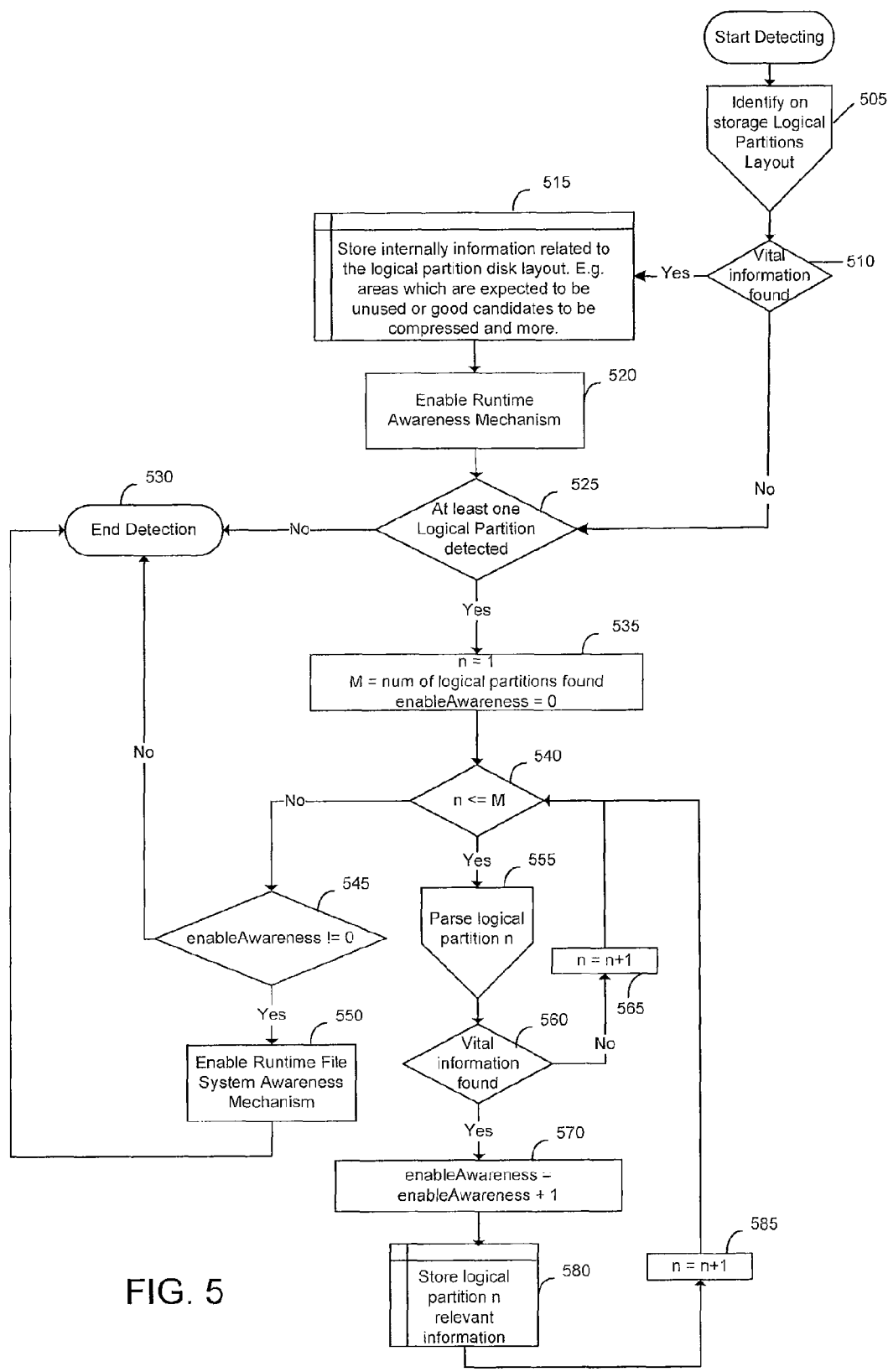
FIG. 5 is a flow chart of a process to detect and analyze usages of logical partitions of an embodiment.
Figure 6:
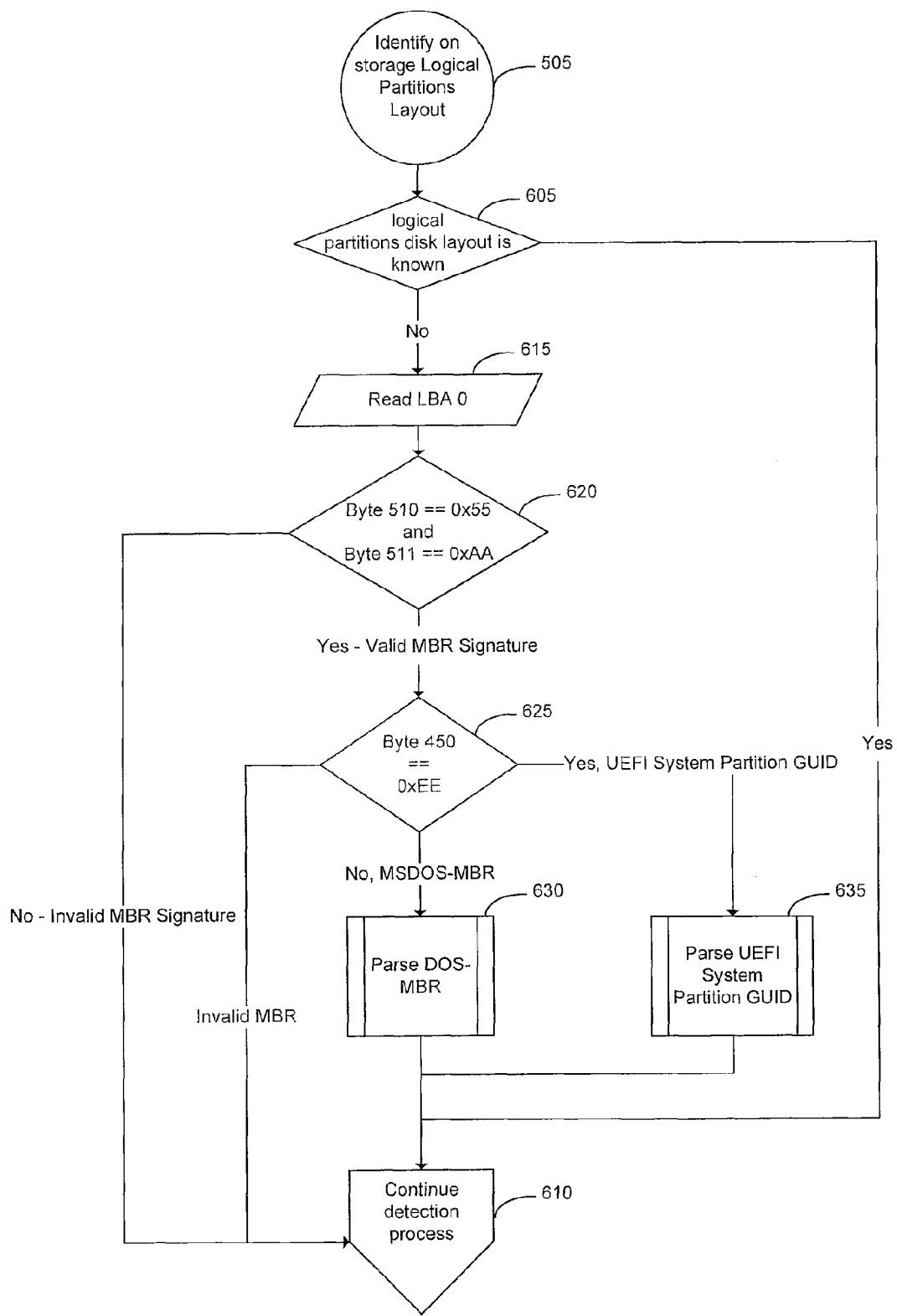
FIG. 6 is a flow chart of a process of identifying logical partition layouts of an embodiment.

Returning to FIG. 3, the next step is to detect and analyze usages of storage logical partitions (act 310). This is shown in more detail in FIG. 5. As shown in FIG. 5, the first step in this process is to identify the storage logical partition layouts (act 505), and this act is shown in more detail in FIG. 6. First, it is determined if the logical partition disk layout is known (act 605). If it is, the detection process continues (act 610). If it is not, LBA 0 is read (act 615), and bytes 510 and 511 are analyzed to determine if they contain certain data (0x55 and 0xAA, respectively), as this indicates a valid MBR signature (act 620). If there isn't a valid MBR signature, the detection process continues (act 610). However, if there is a valid MBR signature, byte 450 is analyzed to see if it contains 0xEE (act 625). If byte 450 does not contain that data, the MBR is an MSDOS MBR, which is then parsed (act 630) before the detection process continues (act 610). Otherwise, the partition is a UEFI system partition GUID, which is then parsed (act 635) before the detection process continues (act 610).

Figure 7:
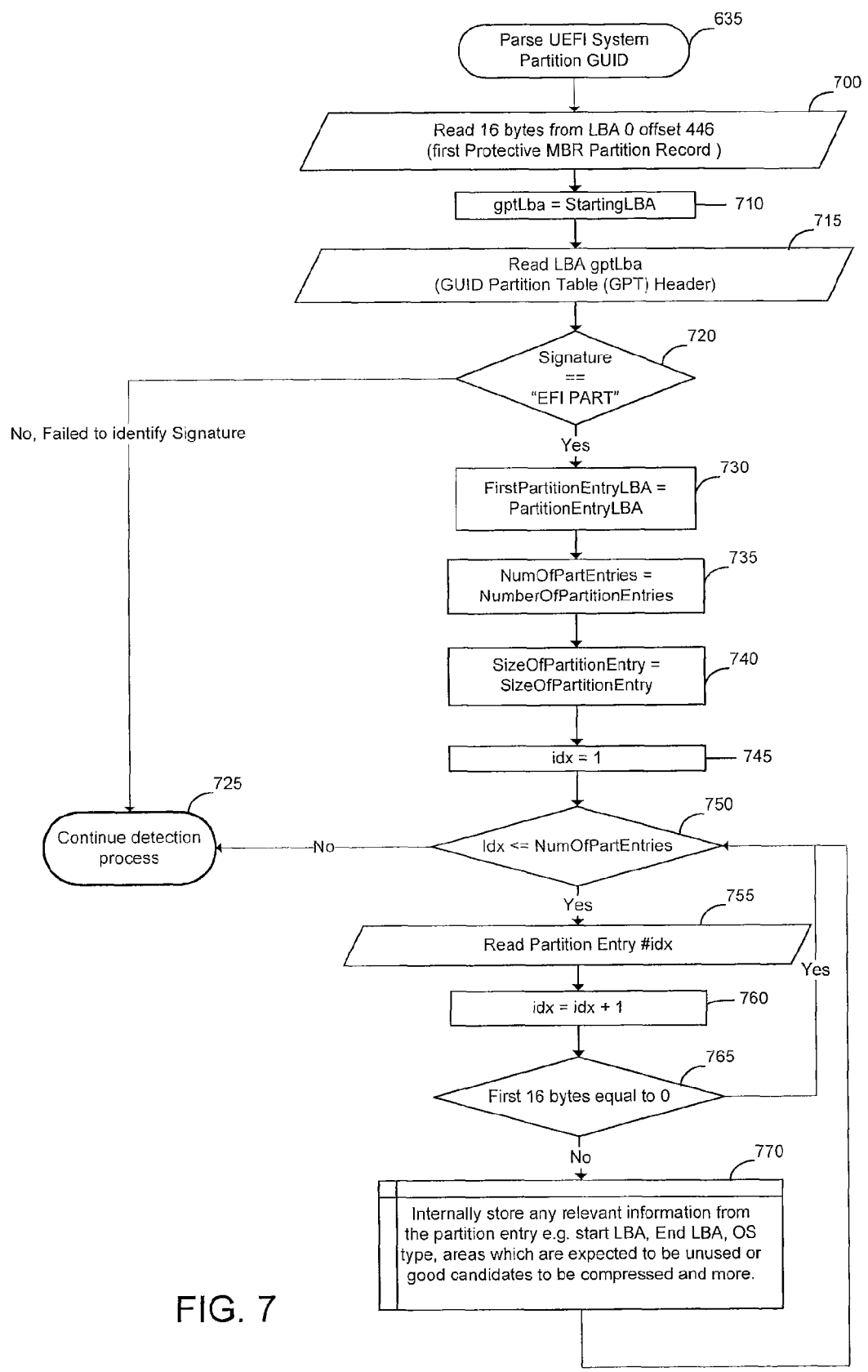
FIG. 7 is a flow chart of a process for parsing a UEFI system partition GUID of an embodiment.

FIG. 7 provides more detail on how to parse the UEFI system partition GUID (act 635). First, 16 bytes are read from LBA 0 offset 446, which is the first protective MBR partition record (act 700). Then, the variable gptLba is set to the staring LBA (act 710). The LBA at this variable is then read to determine if there is a GUID partition table (GPT) header (act 715). If the header is not found, the detection process continues (act 725). However, if the header is found, various variables are set (acts 730-750), and a loop is performed (acts 750-766), resulting in internally storing any relevant information from a partition entry (e.g., start LBA, end LBA, OS type, areas that are expected to be unused, or areas that are good candidates to be compressed) (act 770).

Figure 8:
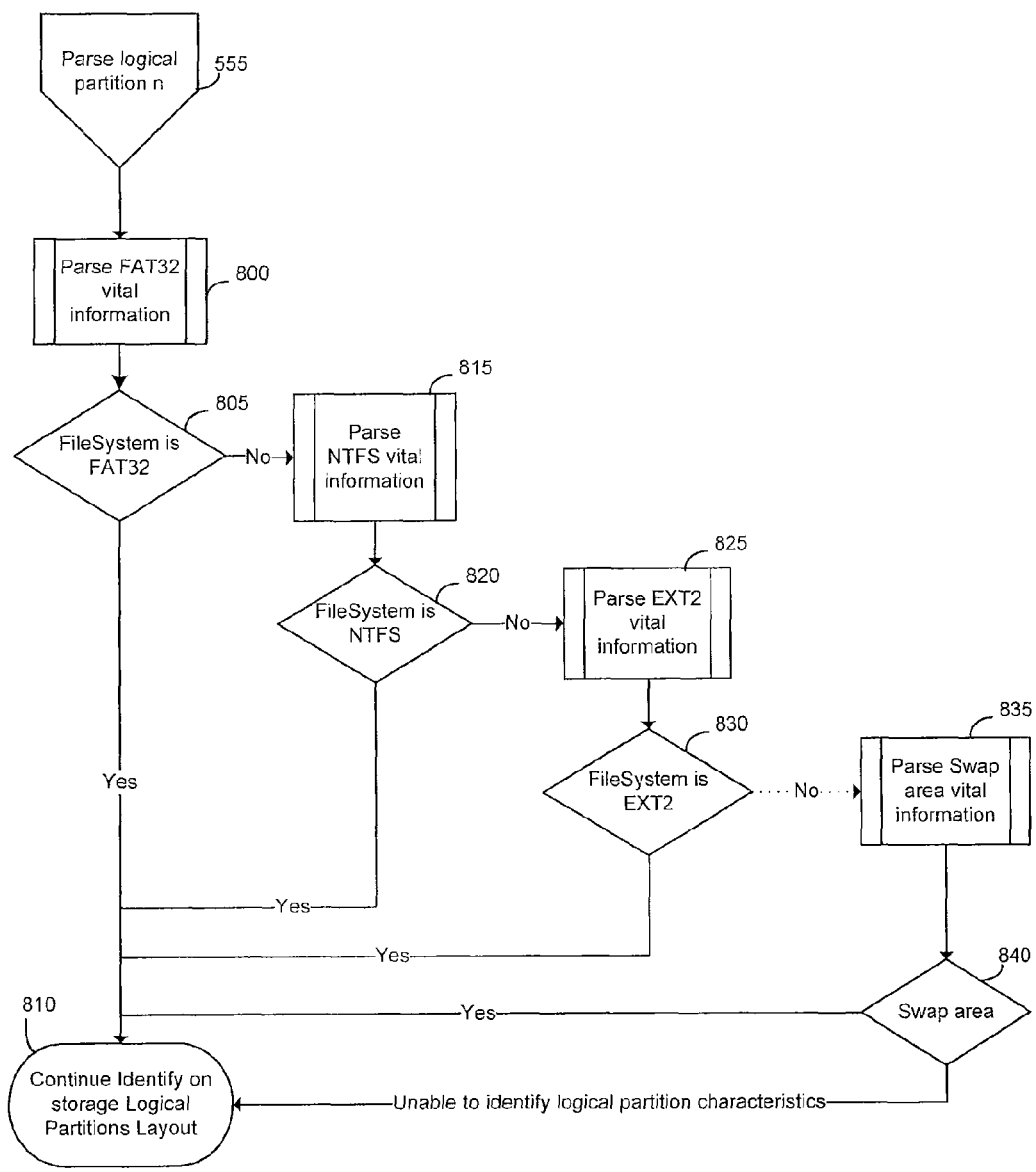
FIG. 8 is a flow chart of a process for parsing a logical partition of an embodiment.
Figure 9:
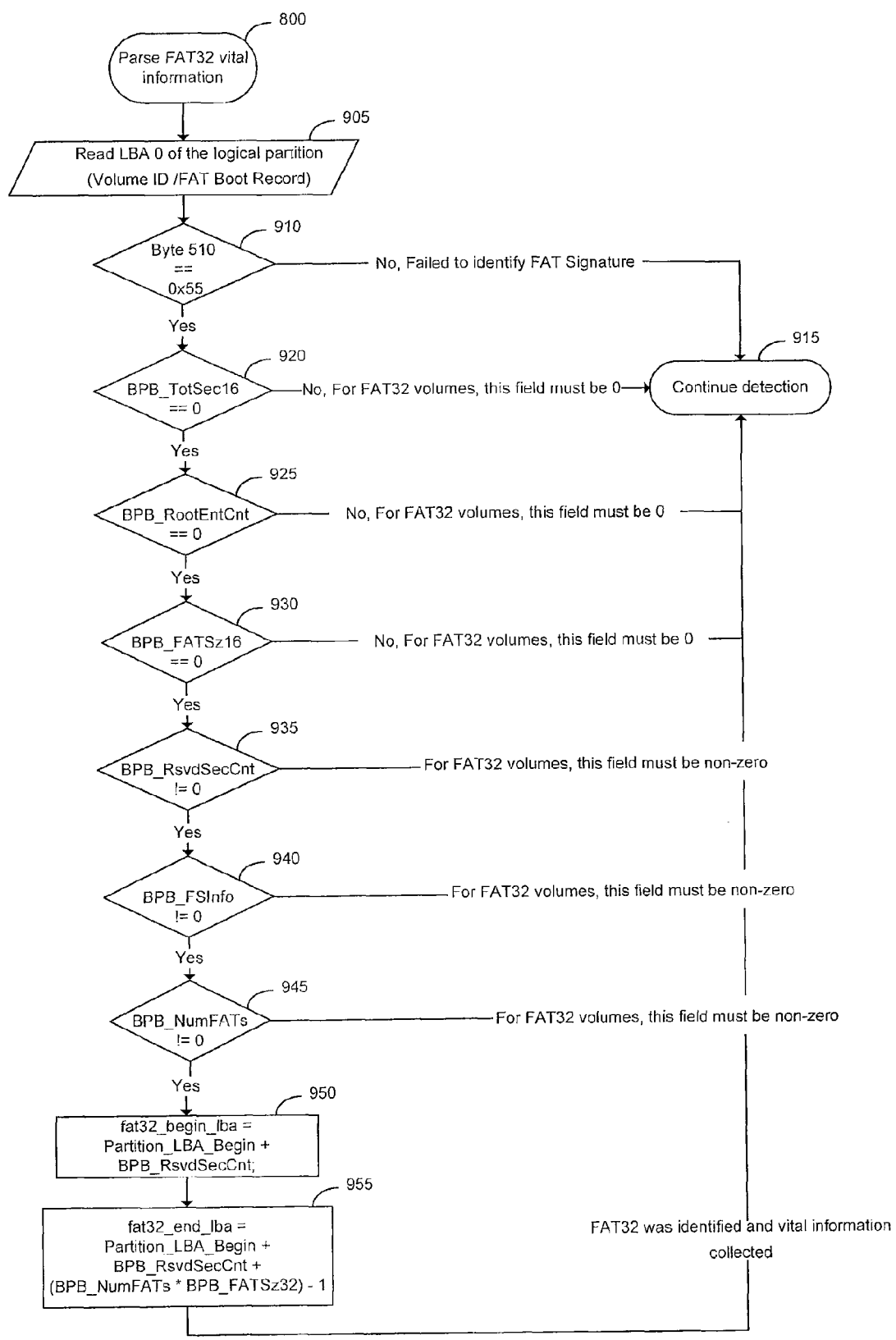
FIG. 9 is a flow chart of a process for parsing FAT32 vital information of an embodiment.
Figure 10:
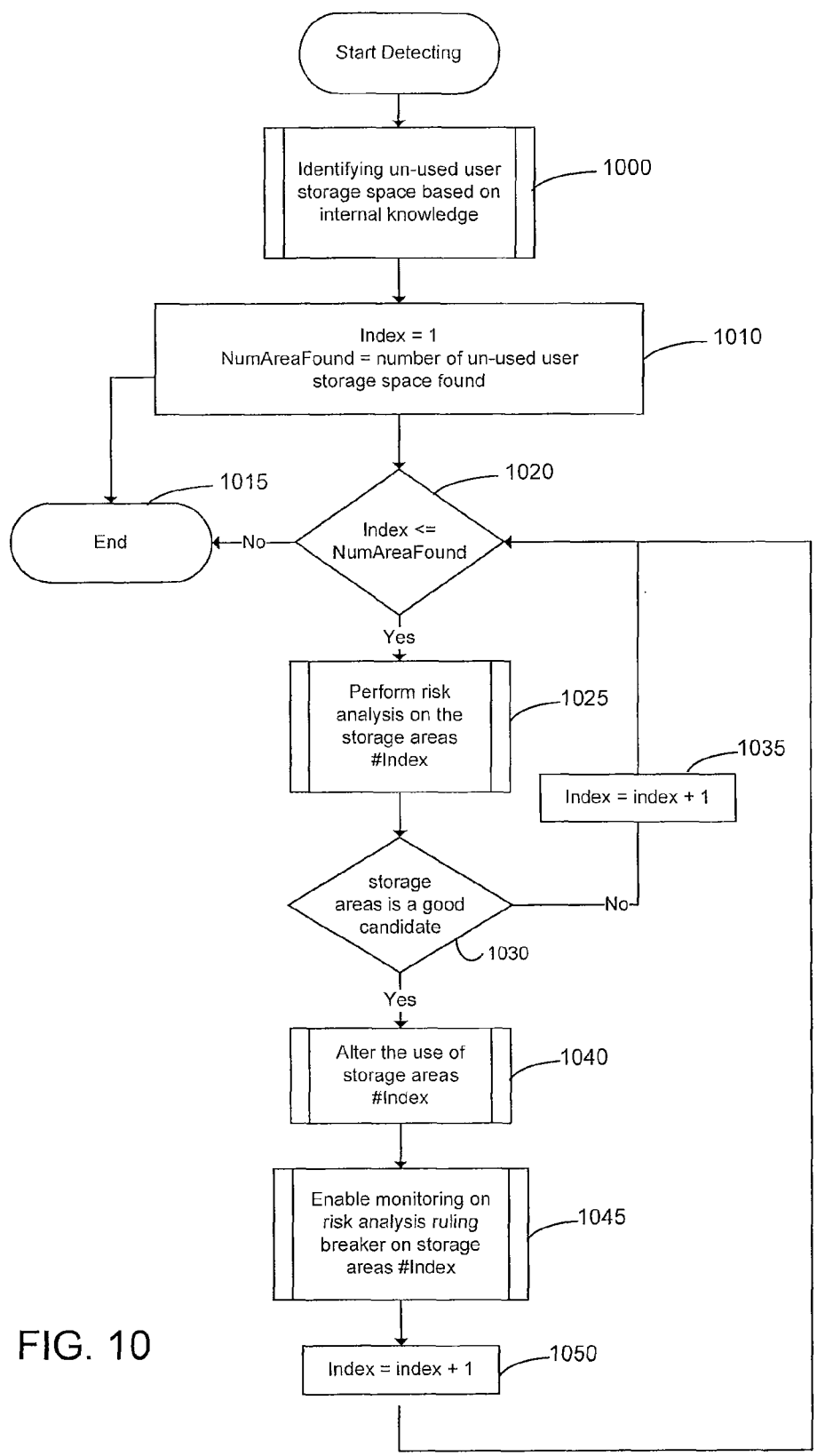
FIG. 10 is a flow chart for performing risk analysis of an embodiment.

Returning to FIG. 5, if such "vital" information is found (act 510), the information related to the logical partition disk layout is internally stored (act 515), and a runtime awareness mechanism is run (act 520) to determine if at least one logical partition is detected (act 525). If at least one logical partition is not detected, the detection process ends (act 530). Otherwise, a loop is entered to cycle through the number of logical partitions that were found (acts 525-585). As part of this process, a given logical partition is parsed (act 555), and this act is shown in more detail in FIG. 8. As shown in FIG. 8, part of this process is to determine if various file systems are used and then to parse the vital information from such systems (acts 800-840). An example of this process for one file system (FAT32) will be illustrated, as the processes for the other file systems can be understood to be similar to this example, with the necessarily adjustments made due to the particulars of the given file system. Parsing a FAT32 file system for vital information is shown in more detail in FIG. 9. As shown in FIG. 9, LBA 0 is read from the logical boot partition (act 905) and various fields are analyzed in order to parse the file system (acts 910-955). The end of this process is that detection is continued (act 915).

As mentioned above, the information learned from the detection mechanisms described in these figures can be used to optimize host requests handling (such as: read, write, erase or other accesses involving or not involving data). This can enable a storage manager in a storage device to alter its behavior based on knowledge driven by the data stored on it, how this data is stored and accessed (e.g., write/read patterns), and prior system knowledge. This allows the storage device to optimize its operation, as well as achieving higher reliability, without involved the host device.

Embodiments Relating to Utilizing Un-Used Storage Space for Storage Device Internal needs Storage devices today may contain storage space which, in high probability, will not be used during the lifetime of the storage device. Despite the fact that this storage space is not being used, this area in the memory is not exploited for other purposes by the storage device. An example for such unused storage space is LBAs (Logical Blocks) that reside in between two logical partitions, one not starting immediately after the previous one ends. Thus, today's storage devices do not use any pre-defined knowledge about the data stored in the storage device to optimize the storage management by better exploiting un-used user space. For example, in the situation described above, the unused LBA addresses between logical partitions are never accessed by the host.

In this embodiment, the storage device uses already-retrieved knowledge on data being transferred to/from it as well as the way this data is being transferred (e.g. protocol, pattern, etc.) to identify non-active storage areas in the memory that, in high probability, will not be used. This provides the storage device 100 with the ability to better exploit unused user storage areas in the memory, which may optimize storage behavior and improve reliability and performance of the device.

In this embodiment, the storage device 100 can first identify unused user storage space based on internal knowledge, such as the determining the logical partition layout, as discussed in the previous embodiment. Examples of such unused storage areas include, but are not limited to, storage areas located between two logical partitions (not covered by any of them) and a storage area with distinct purposes (e.g., both eMMC boot partitions if they are not used by the host device and an eMMC RPMB partition).

The storage device 100 can then perform risk analysis on the identified storage areas to determine characteristics of the identified storage areas. These "area characteristics" can include, but are not limited to, an area size and LBA range that should stand to the minimum internal requirements, the type of memory area (e.g., normal/fast areas, technology (x Bit per Cell)), area location significance (e.g. an area located between two logical partition as described above should be fairly safe to use), areas where usage is well defined (e.g., boot and RPMB partitions in eMMC 4.3 onwards storage devices), area access frequency (e.g., detecting how often, if at all, a proposed area was accessed by the host device), and area data content (e.g., an area contained erased data or obsolete data). The storage device 100 can also perform risk analysis to determine if a rule would be violated. The storage device 100 can identify a set of rules that, when violated, disable the storage manager's internal usage of the selected area. This can happen, for example, when a storage disk layout would be modified or when accessing or modifying an area in between two logical partitions.

Based on the risk analysis, the use of a selected area can be altered so as to be used and managed as required by the storage manager of the storage device 100 for performing a variety of internal operations, without the host device's knowledge. Such operations may include, but are not limited to, improving the storage manager's I/O transactions handling, self-maintenance and housekeeping, and improved power failure immunity, reliability and performance.

In case a selected area contains valid data (e.g., data that was not erased), the storage manager can operate to maintain the integrity of the data, which may include compressing the data to utilize at least part of the range, as will be described in more detail in the next section. Also, in one embodiment, the total exported capacity reported to the host device remains unchanged (i.e., as if the unused storage space was not identified and reused), maintaining the original storage capacity.

The storage device 100 can also monitor I/O transactions to and from the selected areas that may affect (e.g., abort) the previous ruling with respect to the identified un-used areas. If such a transaction is detected, the storage manager can stop using the selected area(s) for its internal use in a manner transparent to the host device. This can occur, for example, when the host device attempts to reformat the location of a logical partition.

Returning to the drawings, FIGS. 10-13 are flow charts of various processes performed in one particular implementation of the embodiment discussed above. It should be noted that this is merely an example, and other processes can be performed. Starting with FIG. 10, first, the storage device 100 identifies unused user storage space based on internal knowledge (act 1000). This act can be performed as described above in the previous section. Next, a loop is performed to perform risk analysis and rule violation analysis on various areas (acts 1010-1050). Two examples of the risk analysis act (act 1025) are performing a boot partition risk analysis and performing a GPT area risk analysis. These analyses are shown in more detail in FIGS. 11 and 12, respectively.

Figure 11:
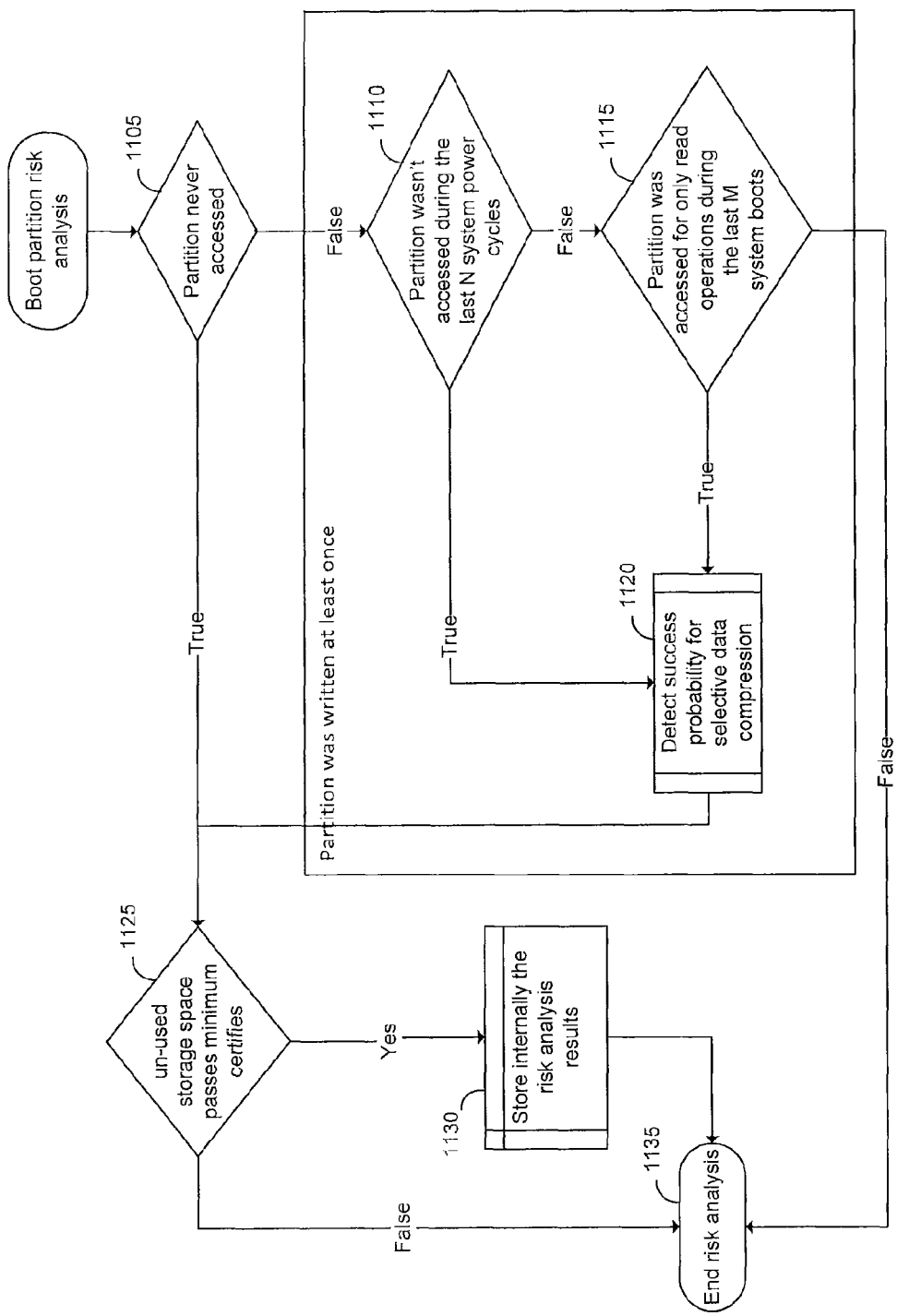
FIG. 11 is a flow chart for performing boot partition risk analysis of an embodiment.
Figure 12:
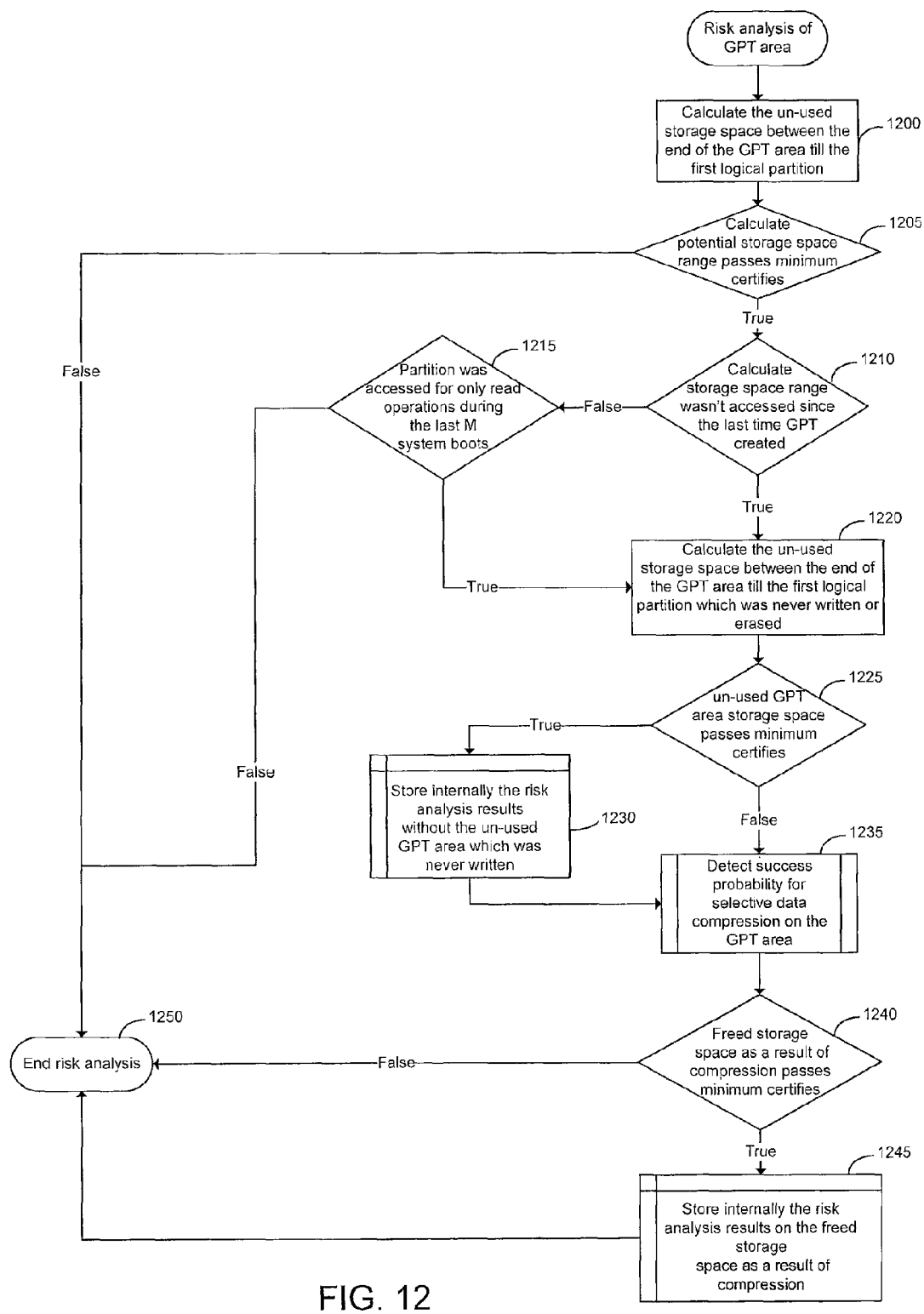
FIG. 12 is a flow chart for performing risk analysis of a GPT area of an embodiment.

FIG. 11 relates to the risk analysis of a boot partition. As shown in FIG. 11, the storage device 100 first determines if a partition was ever accessed (act 1105). If the partition was accessed, it is then determined if the partition was accessed at least once (acts 1100, 1115, and 1120). Otherwise, the storage device 100 determines if the unused storage space passes minimum criteria (act 1125), and either internally stores the risk analysis results (act 1130) or ends the risk analysis (act 1135). FIG. 12 shows the various acts (acts 1200-1250) that can be performed to perform risk analysis of the GPT area.

Figure 13:
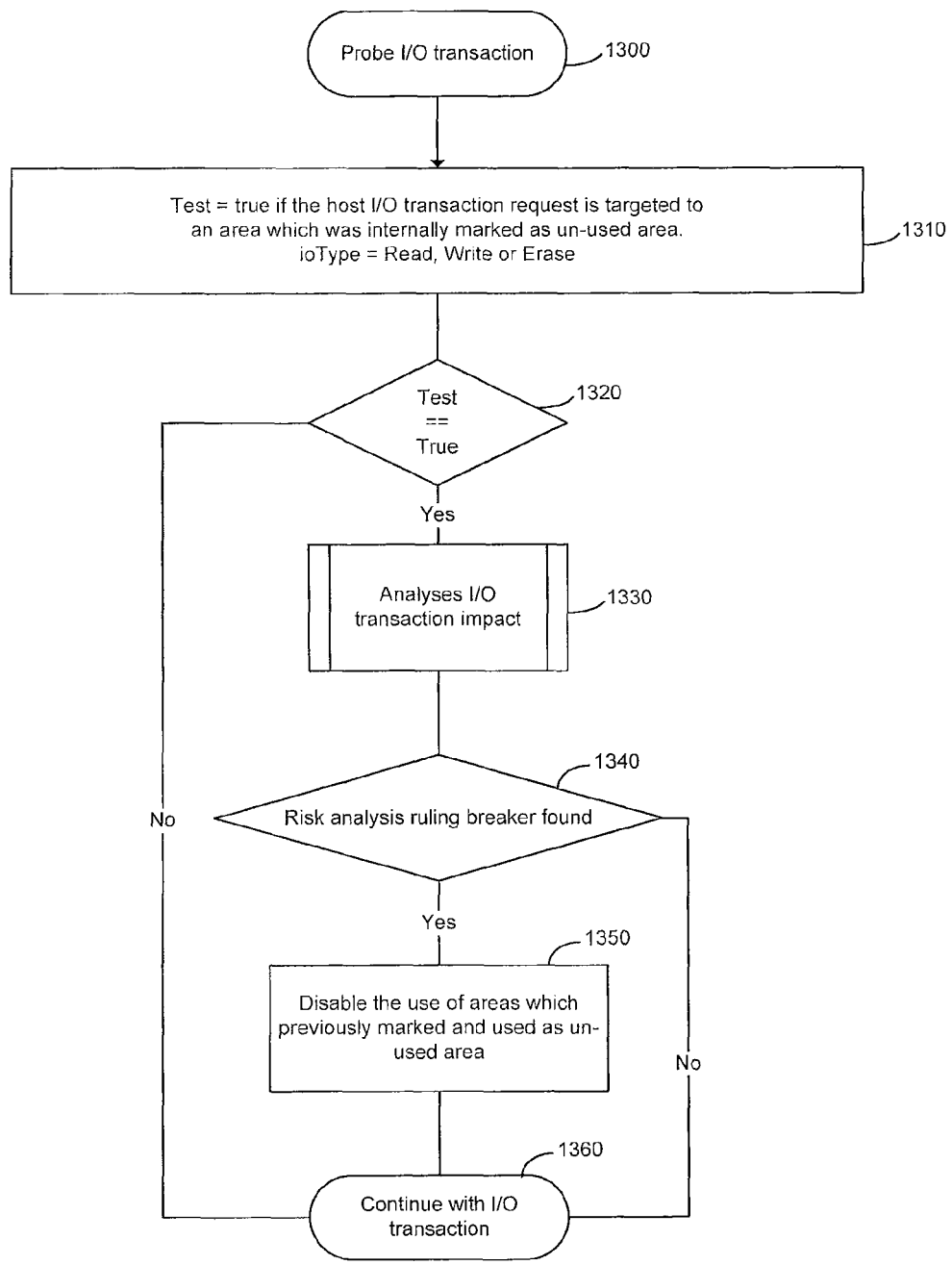
FIG. 13 is a flow chart for determining a rule violation of an embodiment.
Figure 14:
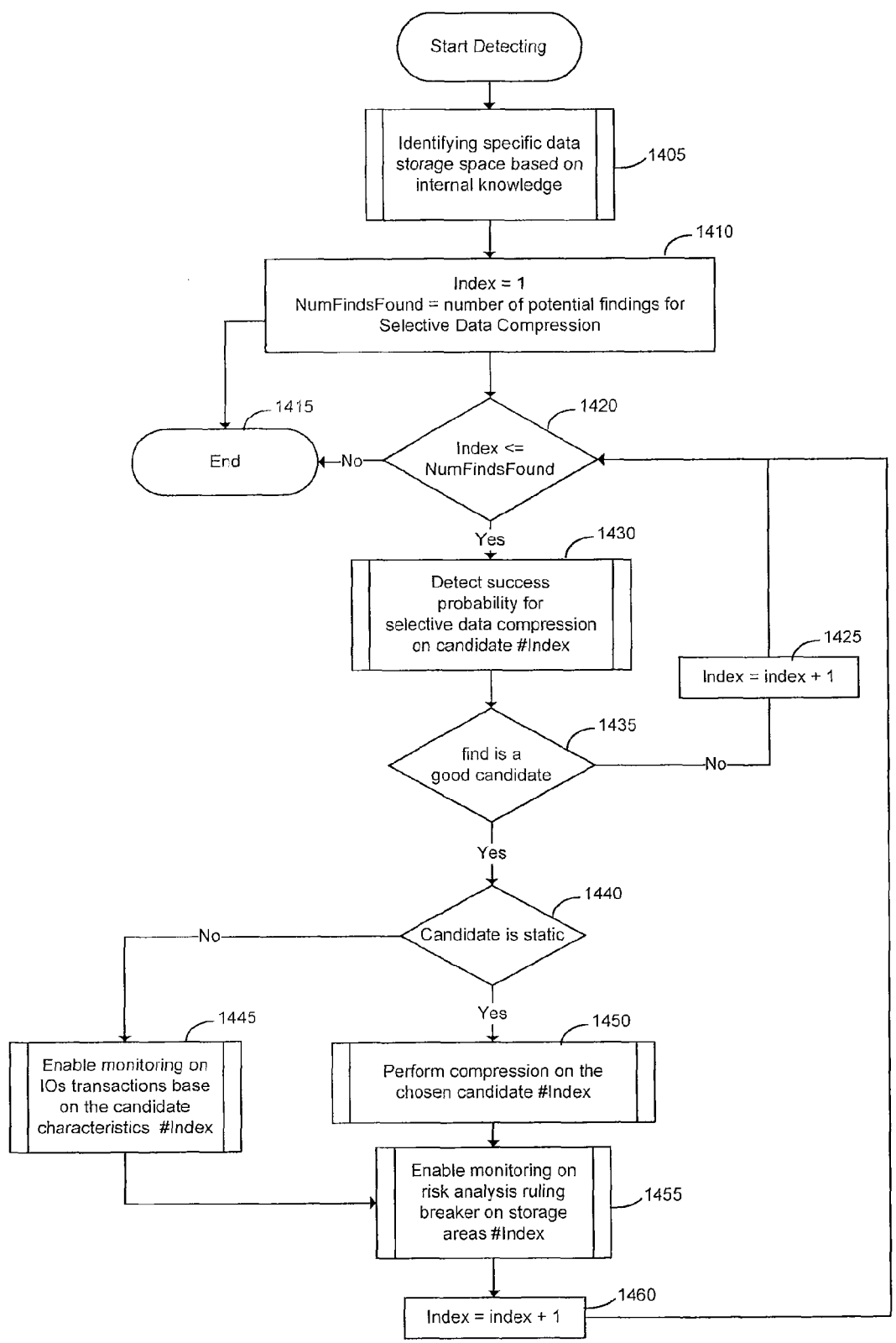
FIG. 14 is a flow chart for performing data compression analysis of an embodiment.

Returning to FIG. 10, act 1045 relates to determining if there would be a violation of a rule, and FIG. 13 provides more detail on one possible implementation of that act. As shown in FIG. 13, an I/O transaction is probed (act 1300). A test is then applied (act 1310). Based on the results of the test (act 1320), either a determination of risk breaking rules is performed (acts 1330-1350) or the I/O transaction is continued (act 1360).

Embodiments Relating to Selective Data Compression

Most storage devices that use on-the-fly compression do not take into consideration the type of data that is being compressed or any other relevant knowledge relating to data already stored in the storage device, nor do they take into consideration any pre-defined knowledge about the data to be compressed and/or any previous-related transactions to and from the storage device which may affect the way and the efficiency of the compression that is being performed. In this embodiment, the storage device 100 utilizes already-retrieved knowledge on data being transferred to/from it or data that is already stored to perform selective on-the-fly data compression and background maintenances compression by the storage manager. This enables the storage device to alter its behavior based on knowledge driven by the data stored on it, how this data is stored and accessed (e.g. write/read patterns), and prior system knowledge. Such different behaviors can provide the ability to compress only data which has high compression efficiency while preventing compressing data having a low compression efficiency, thereby optimizing overall system performance.

In one embodiment, the storage device 100 first identifies specific data storage space based on internal knowledge, such as the logical partition layout, as described above. Examples of data that may be suitable for compression include, but are not limited to, data that is identified as being less sensitive to performance such as backup data, data that has a relatively-high compression efficiency (e.g., texts files), and data that is rarely accessed. Examples of data that may be less ideal for compression include, but are not limited to, data that is frequently rewritten and reread and if compressed, may result in reduced performance (e.g., FAT tables of FAT32 file system), as well as data that has relatively-low compression efficiency (e.g., jpeg file images).

Next, the storage device 100 performs risk and compression analysis on the identified storage areas or data transaction. This analysis can involve determining what compression algorithm to use based on one or more of the following: potential compression on the data, access and modification frequency of the data, and performance impacts, such as duration of the compression algorithm; uncompressing and reading the compressed data; and modifying already-compressed data. The analysis can also involved compression scheduling (e.g., should the compression occur on-the-fly, as an internal background operation or any other storage manager idle time), as well as determining whether a rule, if violate, should disable the compression process (e.g., reformatting a logical partition and changes in the data is frequently being accessed and/or modified.

Based on the risk and compression analysis, the storage device 100 can select storage areas or data transactions that will be managed as needed by the storage manager for performing a variety of internal operations, transparently to the host device. Such operations can include, but are not limited to, reducing the duration of internal memory write operation, reducing the actual memory space used to store user data and increase available memory space the storage manager internal work, improving the internal memory mapping mechanism, and reducing write amplification to improve overall product life cycle.

In one embodiment, the total user space reported to the host device will at least remain unchanged to the original storage capacity, so that the storage management described herein is transparent to the host device. For example, 100 MB of data which is compressed to 20 MB will still appear as 100 MB of data. It may also be desired to include an internal mechanism that will monitor I/O transactions to the storage device 100 to identify any violation of a rule on the selected area(s) and data being compressed. If such a transaction is monitored, the storage manager of the storage device 100 can stop the compression method on the selected area(s) or data, transparently to the host device. Such a situation can occur, for example, when reformatting the location of the logical partition.

Figure 15:
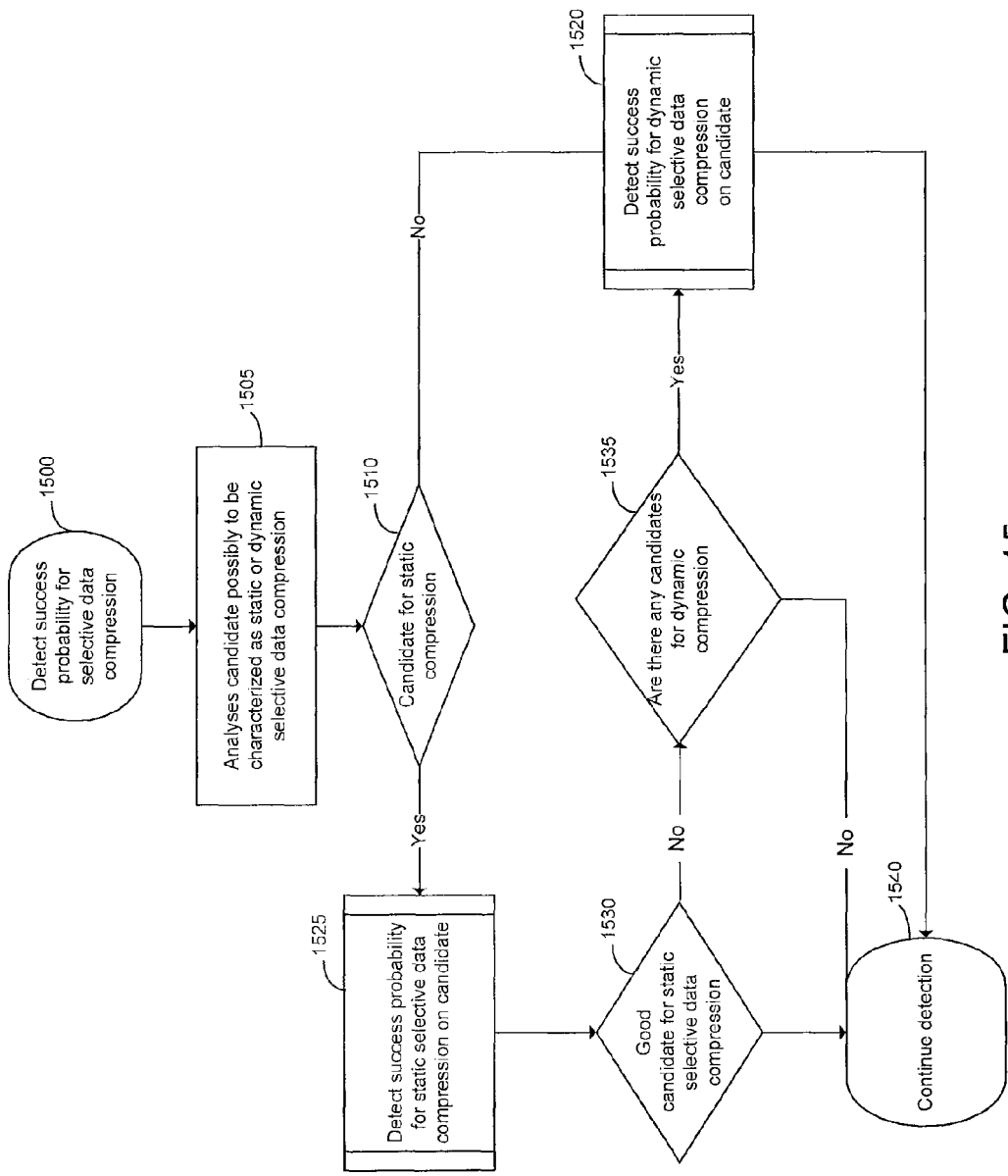
FIG. 15 is a flow chart for detecting a success probability for selective data compression of an embodiment.
Figure 16:
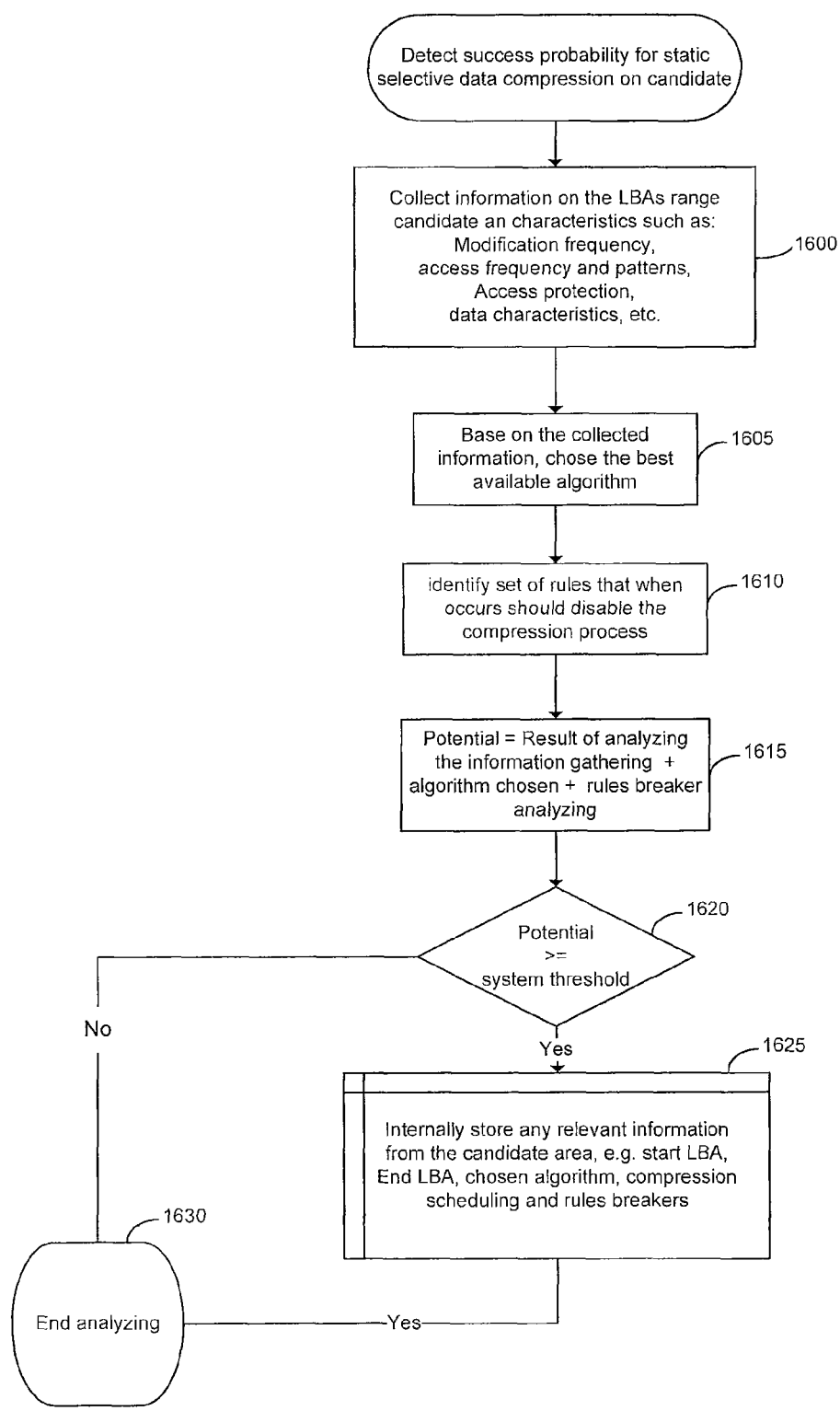
FIG. 16 is a flow chart for detecting a success probability for static selective data compression of an embodiment.
Figure 17:
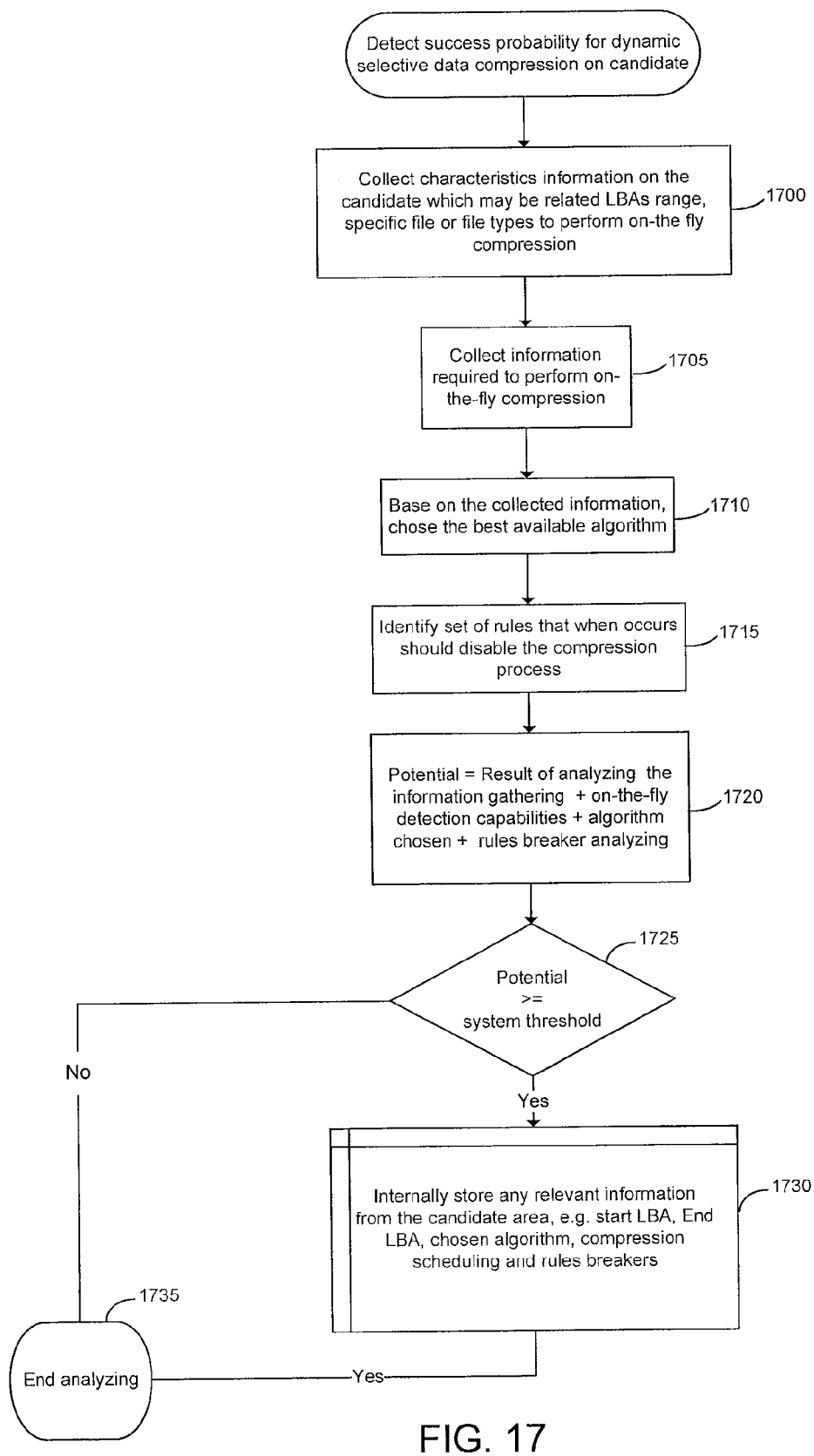
FIG. 17 is a flow chart for detecting a success probability for dynamic selective data compression of an embodiment.

Returning to the drawings, FIGS. 14-17 are flow charts of various processes performed in one particular implementation of the embodiment discussed above. It should be noted that this is merely an example, and other processes can be performed. Starting with FIG. 14, first, the storage device 100 identifies unused user storage space based on internal knowledge (act 1400). This act can be performed as described above in the previous section. Next, a loop is performed to detect the success for selective data compression on a candidate (acts 1410-1460). FIG. 15 (acts 1500-1540) provides more detail on the detecting act (act 1430). This example contemplates that there can be two types of candidates: static (e.g., an address range) and dynamic (e.g., a file). Detecting the success probability of static selective data compression on a candidate is shown in acts 1600-1630 in FIG. 16, while detecting the success probability of dynamic selective data compression on a candidate is shown in acts 1700-1735 in FIG. 17.

CONCLUSION

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

What is claimed is:

1. A method for selective user data compression, the method comprising:
    performing the following in a storage device in communication with a host device, the storage device having a non-volatile memory:
        determining whether user data stored in a storage area in the memory is suitable for compression;
        if it is determined that the user data is suitable for compression, compressing the user data; and
        using free memory space resulting from compressing the user data for an internal storage device operation, wherein a capacity reported to the host device as being available for storing additional user data remains unchanged after compressing the user data, and wherein the free memory space is not used for additional user data.

2. The method of claim 1, wherein determining whether user data is suitable for compression comprises determining whether the user data is backup data.

3. The method of claim 1, wherein determining whether user data is suitable for compression comprises determining a compression efficiency for the user data.

4. The method of claim 1, wherein determining whether user data is suitable for compression comprises determining an access frequency of the user data.

5. The method of claim 1 further comprising determining a compression algorithm to use to compress the user data.

6. The method of claim 1 further comprising determining a schedule for compressing the user data.

7. The method of claim 1 further comprising determining whether compressing the user data would violate a rule.

8. The method of claim 7, wherein the rule is violated if a logical partition is reformatted.

9. The method of claim 7, wherein the rule is violated if a change is made to user data that is frequently accessed or modified.

10. The method of claim 1 further comprising monitoring I/O transactions from the host device to determine if a rule is violated by utilizing the free memory space resulting from compressing the user data.

11. A storage device comprising:
a non-volatile memory; and
a controller in communication with the non-volatile memory, the controller configured to:
determine whether user data stored in a storage area in the memory is suitable for compression;
if it is determined that the user data is suitable for compression, compress the data; and
use free memory space resulting from compressing the user data for an internal storage device operation, wherein a capacity reported to a host device as being available for storing additional user data remains unchanged after compressing the user data, and wherein the free memory space is not used for additional user data.

12. The storage device of claim 11, wherein determining whether user data is suitable for compression comprises determining whether the user data is backup data.

13. The storage device of claim 11, wherein determining whether user data is suitable for compression comprises determining a compression efficiency for the user data.

14. The storage device of claim 11, wherein determining whether user data is suitable for compression comprises determining an access frequency of the user data.

15. The storage device of claim 11, wherein the controller is further operative to determine a compression algorithm to use to compress the user data.

16. The storage device of claim 11, wherein the controller is further operative to determine a schedule for compressing the user data.

17. The storage device of claim 11, wherein the controller is further operative to determine whether compressing the user data would violate a rule.

18. The storage device of claim 17, wherein the rule is violated if a logical partition is reformatted.

19. The storage device of claim 17, wherein the rule is violated if a change is made to user data that is frequently accessed or modified.

20. The storage device of claim 11, wherein the controller is further configured to monitor I/O transactions from the host device to determine if a rule is violated by utilizing the free memory space resulting from compressing the user data.

* * * * *